(12) United States Patent
Yu

(10) Patent No.: US 8,796,141 B2
(45) Date of Patent: Aug. 5, 2014

(54) METHOD FOR FABRICATING SEMICONDUCTOR DEVICE BY DAMASCENE PROCESS

(75) Inventor: Jae-Seon Yu, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/441,385

(22) Filed: Apr. 6, 2012

(65) Prior Publication Data
US 2013/0149863 A1    Jun. 13, 2013

(30) Foreign Application Priority Data

Dec. 9, 2011    (KR) .................. 10-2011-0132032

(51) Int. Cl.
*H01L 21/44*    (2006.01)

(52) U.S. Cl.
USPC .............. 438/675; 438/637; 257/E21.657

(58) Field of Classification Search
USPC .................. 438/641; 257/E21.613
See application file for complete search history.

(56) References Cited

U.S. PATENT DOCUMENTS 7,763,544 B2 *    7/2010    Bai et al. .............. 438/704

FOREIGN PATENT DOCUMENTS

| KR | 1020050052608 | 6/2005 |
| KR | 100843715 | 6/2008 |
| KR | 1020110001147 | 1/2011 |
| KR | 1020110030782 | 3/2011 |

* cited by examiner

*Primary Examiner* — Cheung Lee
(74) *Attorney, Agent, or Firm* — IP & T Group LLP

(57) ABSTRACT

A method for fabricating a semiconductor device includes forming a plurality of isolation patterns, isolated from each other by a plurality of trenches, over an underlying structure; forming a plurality of conductive lines filled in the trenches, forming contact holes by removing first portions of the isolation patterns, wherein the contact holes are defined by the plurality of conductive lines and second portions of the isolation patterns that remain after removing of the first portions of the isolation patterns, and forming plugs filled in the contact holes.

13 Claims, 28 Drawing Sheets

METHOD FOR FABRICATING SEMICONDUCTOR DEVICE BY DAMASCENE PROCESS

CROSS-REFERENCE TO RELATE APPLICATIONS

The present application claims priority of Korean Patent Application No. 10-2011-0132032, filed on Dec. 9, 2011, which is incorporated herein by reference in its entirety.

BACKGROUND

1. Field

Exemplary embodiments of the present invention relate to a semiconductor device, and more particularly, to a method of fabricating a semiconductor device by a damascene process.

2. Description of the Related Art

As an exemplary process for fabricating semiconductor memory devices, bit lines are first formed, and storage node contact plugs are subsequently formed. For example, bit lines are patterned in the form of lines, and a hole-type contact mask is subsequently formed, followed by etching to form contact holes in which storage node contact masks are to be formed. However, as the integration density of semiconductor devices increases, an area for forming storage node contact plugs decreases, and the height of the storage node contact plugs becomes higher, and thus mask photolithography may have limitations. Such limitations make performing a bit line patterning process and a storage node contact plug process difficult.

SUMMARY

An embodiment of the present invention is directed to a method for fabricating a semiconductor device that may form bit lines without performing a bit line patterning process and may form storage node contact plugs without using a hole-type contact mask.

In accordance with an embodiment of the present invention, a method for fabricating a semiconductor device includes forming a plurality of isolation patterns, isolated from each other by a plurality of trenches, over an underlying structure; forming a plurality of conductive lines filled in the trenches; forming contact holes by removing first portions of the isolation patterns, wherein the contact holes are defined by the plurality of conductive lines and second portions of the isolation patterns that remain after removing of the first portions of the isolation patterns; and forming plugs filled in the contact holes.

In accordance with another embodiment of the present invention, a method for fabricating a semiconductor device includes forming a plurality of sacrificial patterns, isolated from each other by a plurality of first trenches, over an underlying structure; forming a plurality of conductive lines filled in the first trenches; forming second trenches by removing portions of the sacrificial patterns, wherein the sacrificial patterns as a whole extend in a direction crossing the conductive lines; forming isolation patterns filled in the second trenches; forming contact holes by removing the sacrificial patterns, wherein the contact holes are defined by the plurality of conductive lines and the isolation patterns; and forming plugs filled in the contact holes.

In accordance with still another embodiment of the present invention, a method for fabricating a semiconductor device includes forming a plurality of sacrificial patterns, isolated from each other by a plurality of first trenches, over an underlying structure; forming a plurality of conductive lines filled in the plurality of first trenches; forming a plurality of first holes by removing portions of the sacrificial patterns, wherein the sacrificial patterns as a whole extend in a direction crossing the conductive lines; forming isolation patterns filled in the plurality of first holes; forming contact holes by removing the sacrificial patterns, wherein the contact holes are defined by the plurality of conductive lines and the isolation patterns; forming a spacer having an air gap on the sidewalls of the contact holes; and forming plugs filled in the contact holes.

In accordance with yet another embodiment of the present invention, a method for fabricating a semiconductor device includes forming an insulating layer and an etch stop layer over an underlying structure; forming a plurality of sacrificial patterns, isolated from each other by a plurality of first trenches, on the etch stop layer; forming a plurality of bit lines filled in the plurality of first trenches; forming a plurality of first holes by removing portions of the sacrificial patterns, wherein the sacrificial patterns as a whole extend in a direction crossing the conductive lines; forming isolation patterns filled in the plurality of first holes; forming contact holes by removing the sacrificial patterns, wherein the contact holes are defined by the plurality of bit lines and the isolation patterns; etching the etch stop layer and the insulating layer at the bottom of the contact holes; etching exposed sidewalls of the insulating layer; and forming storage node contact plugs filled in the contact holes.

DETAILED DESCRIPTION

Figure 1A:
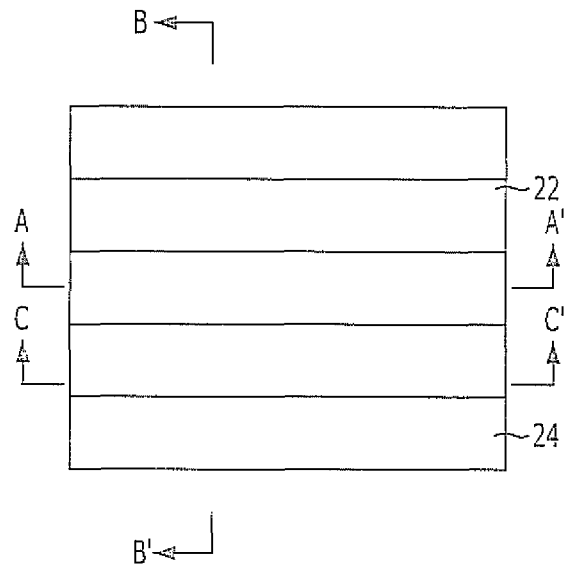
FIGS. 1A to 1H are top views illustrating a method of fabricating a semiconductor device according to a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
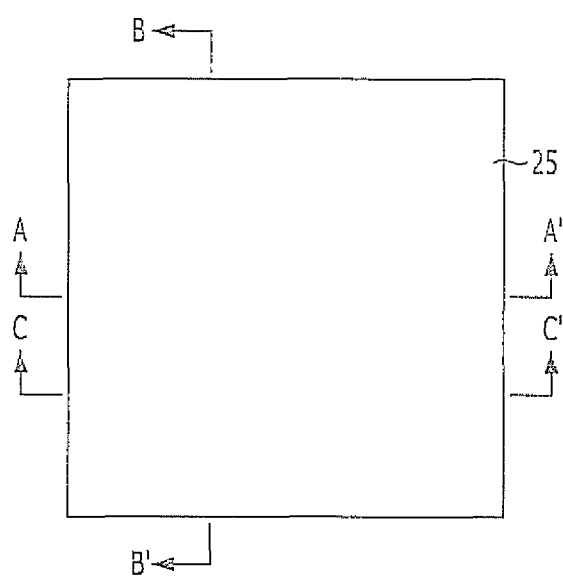
Figure 1C:
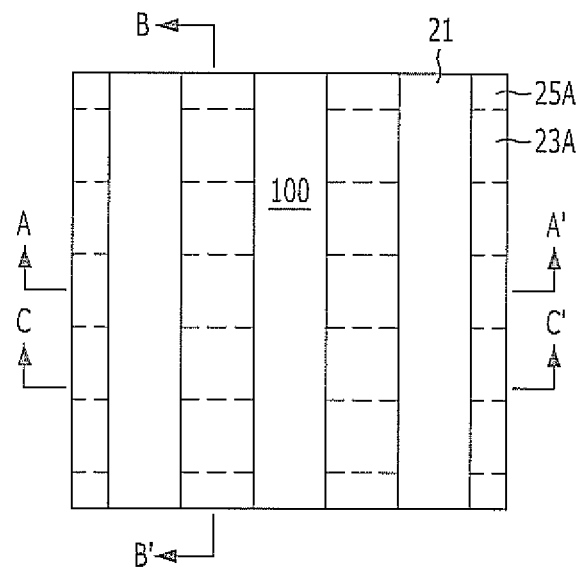
Figure 1D:
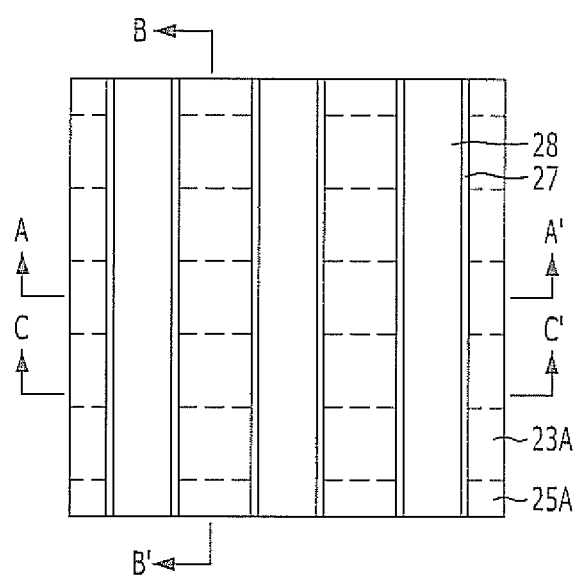
Figure 1E:
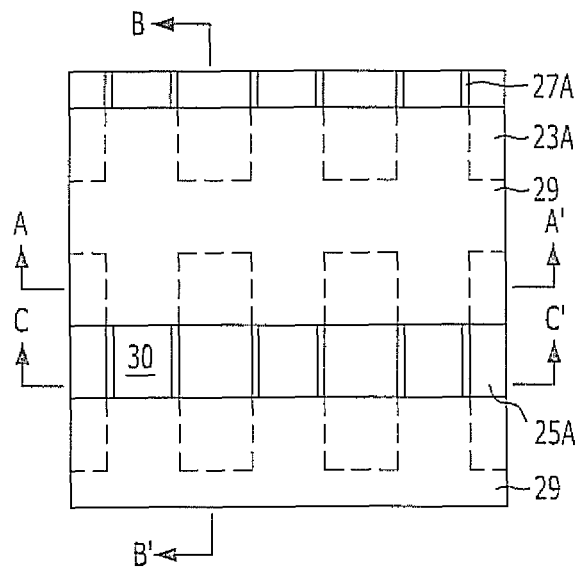
Figure 1F:
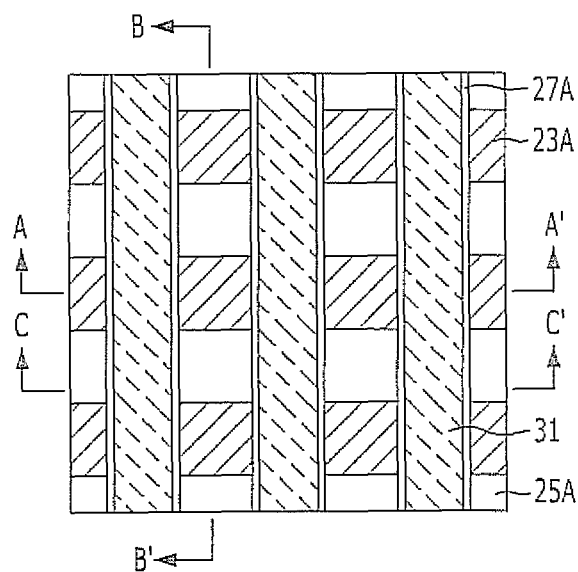
Figure 1G:
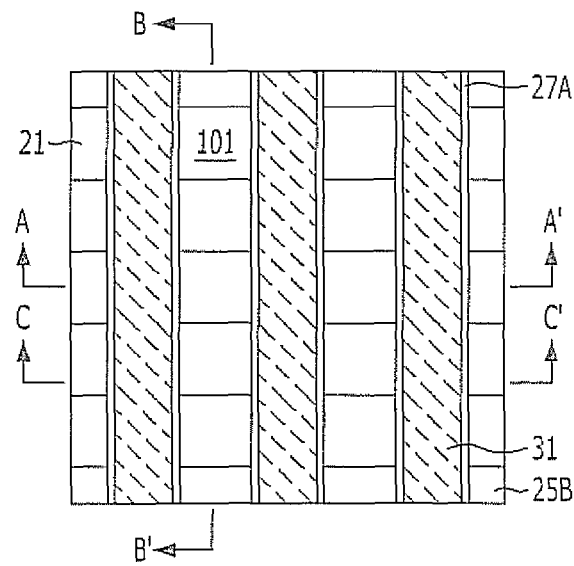
Figure 1H:
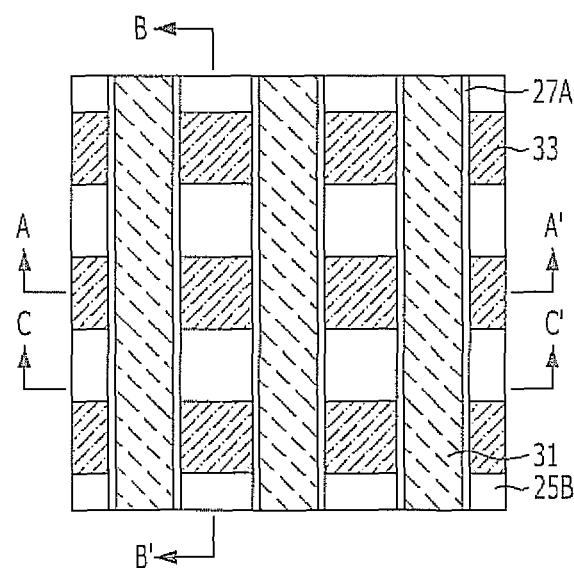
Figure 2A:
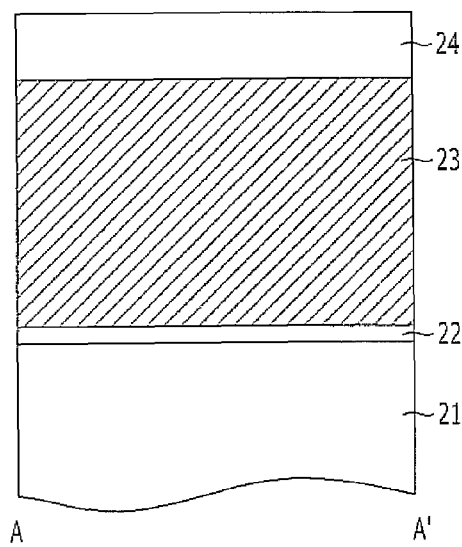
FIGS. 2A to 2H, 3A to 3H and 4A to 4H are cross-sectional views taken along lines A-A', B-B' and C-C' of FIGS. 1A to 1H, respectively.
Figure 2B:
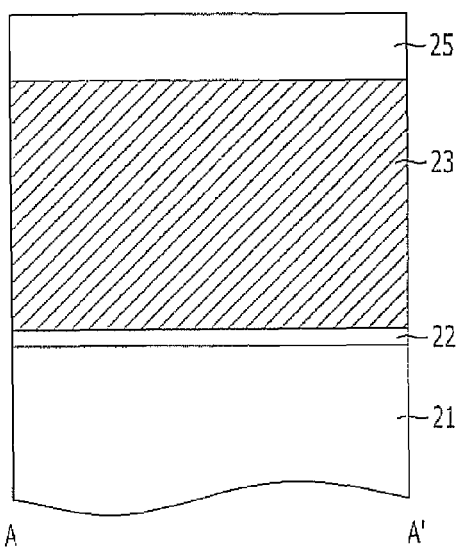
Figure 2C:
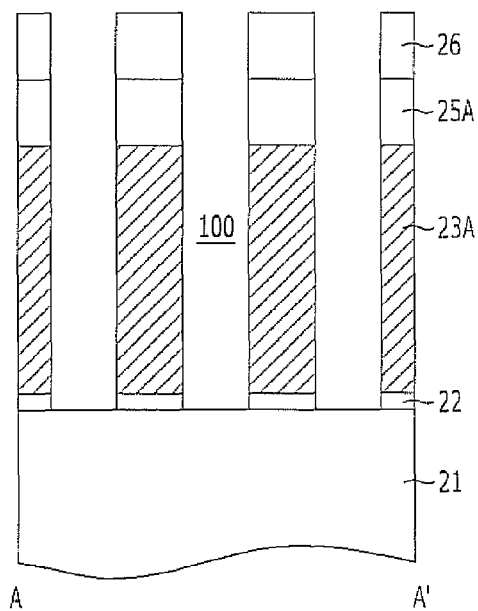
Figure 2D:
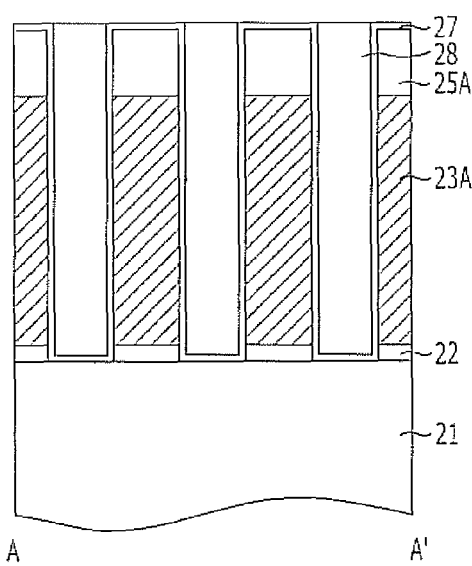
Figure 2E:
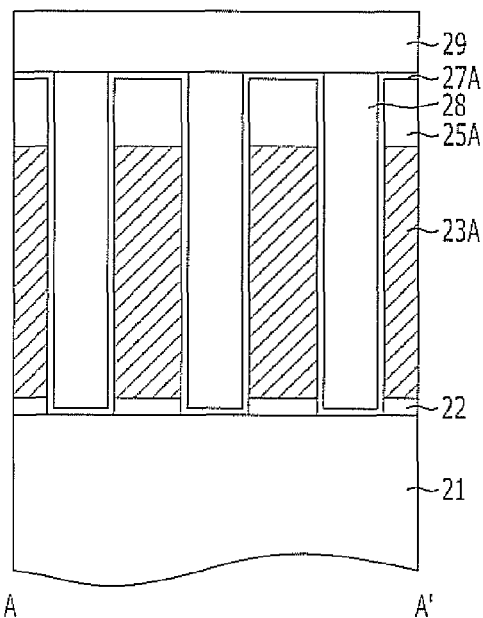
Figure 2F:
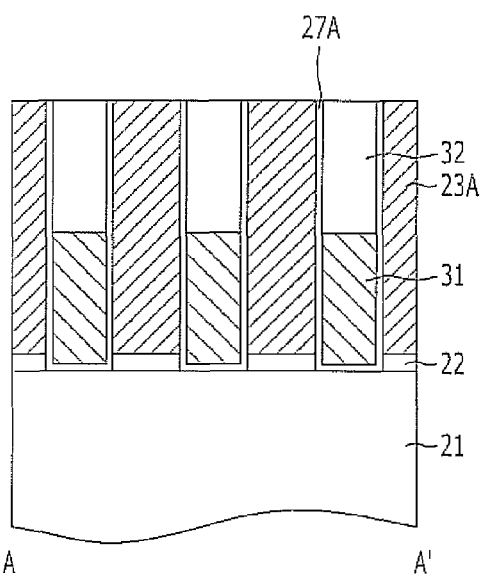
Figure 2G:
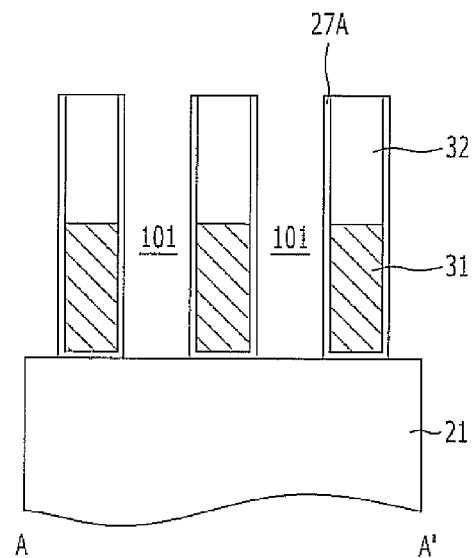
Figure 2H:
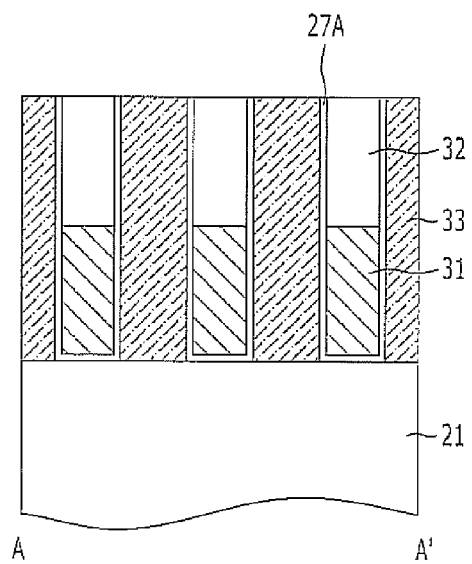
Figure 3A:
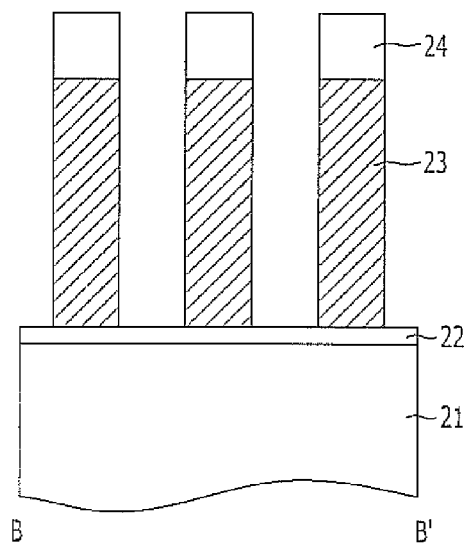
Figure 3B:
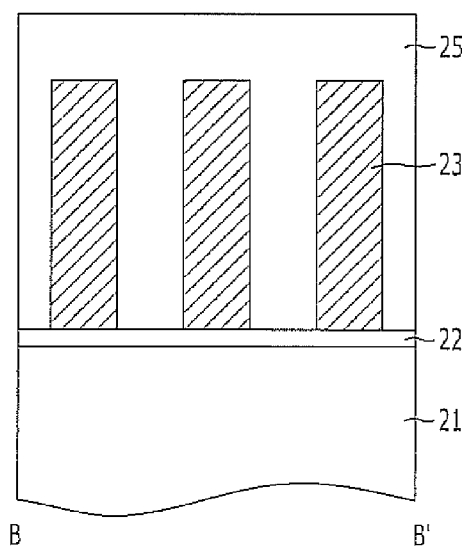
Figure 3C:
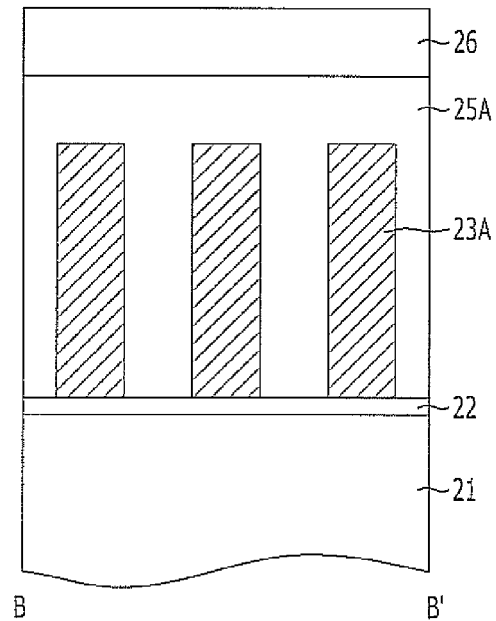
Figure 3D:
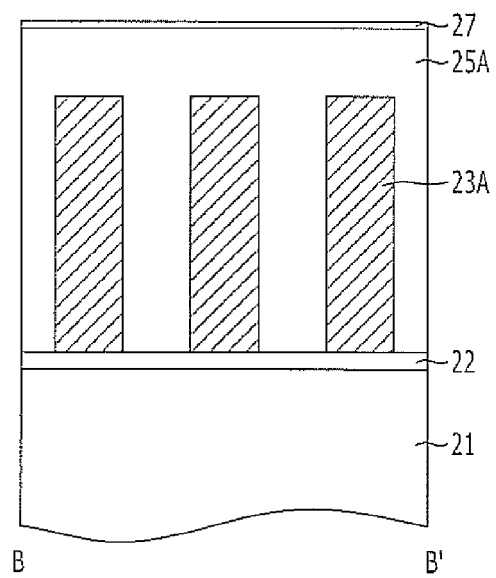
Figure 3E:
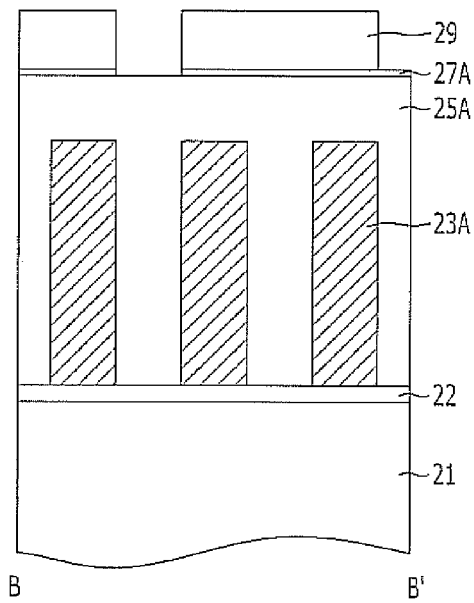
Figure 3F:
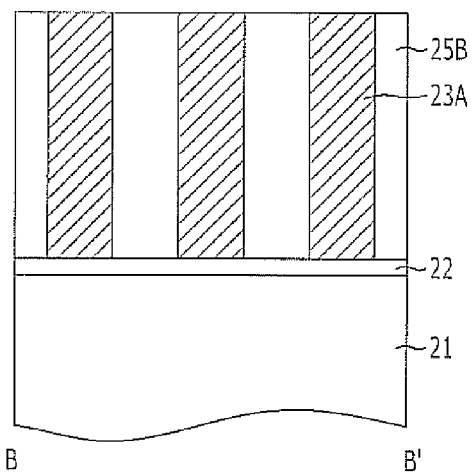
Figure 3G:
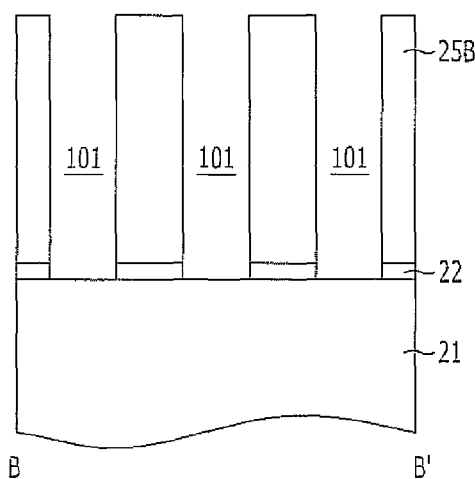
Figure 3H:
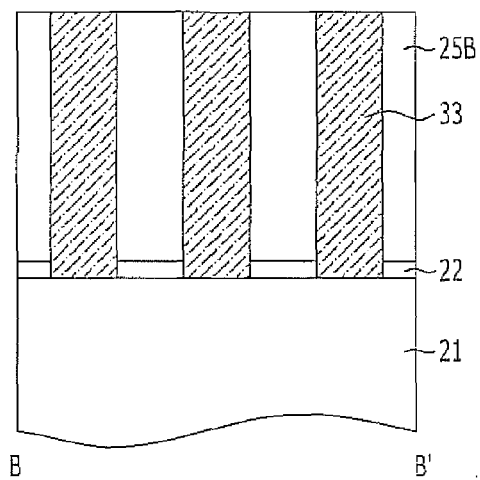
Figure 4A:
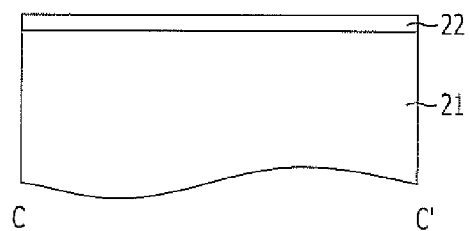
Figure 4B:
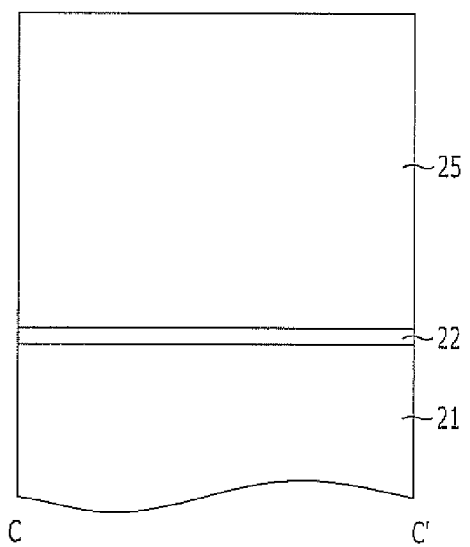
Figure 4C:
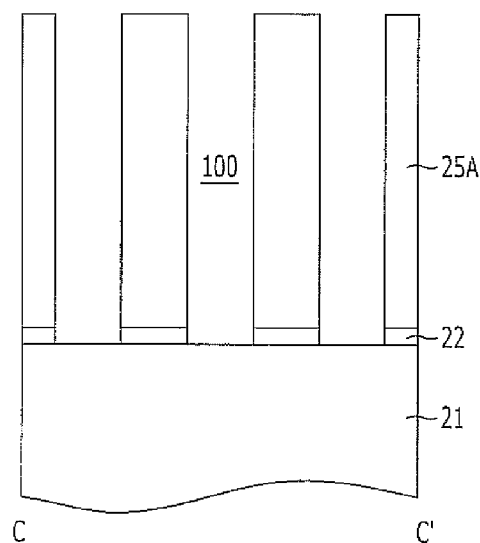
Figure 4D:
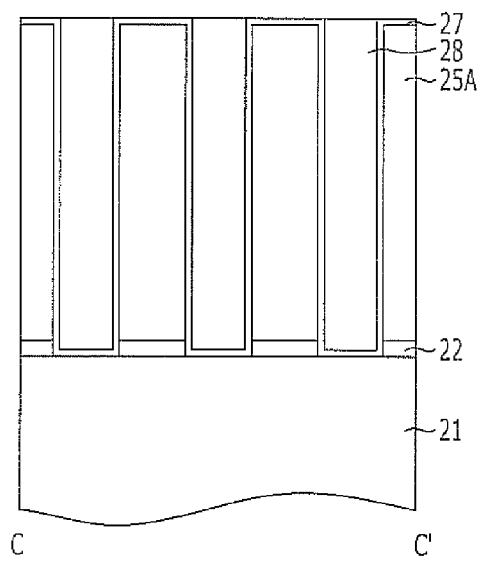
Figure 4E:
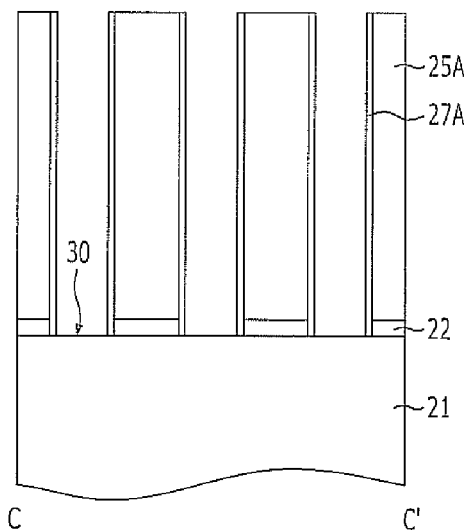
Figure 4F:
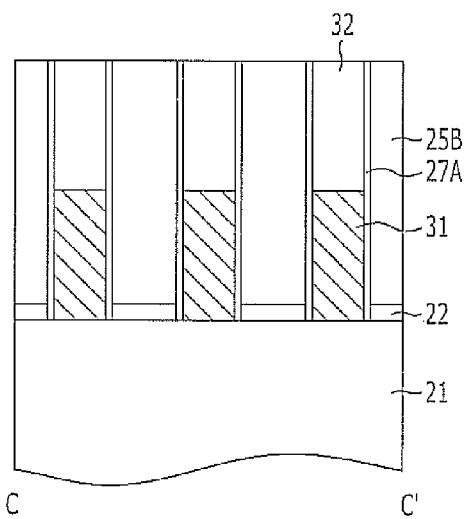
Figure 4G:
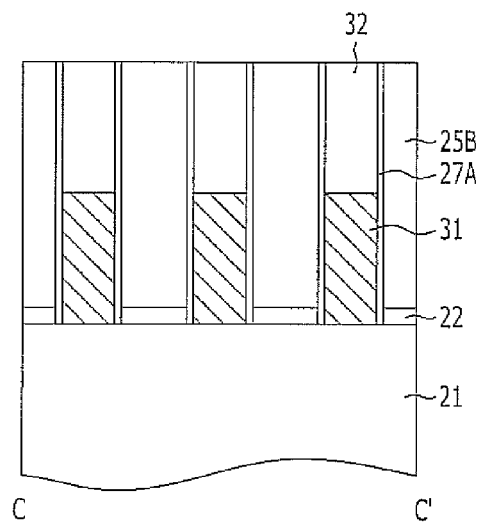
Figure 4H:
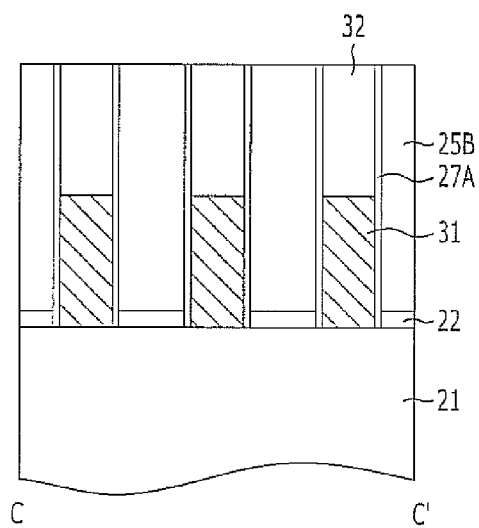

FIGS. 1A to 1H are top views illustrating a method of fabricating a semiconductor device according to a first embodiment of the present invention. FIGS. 2A to 2H, 3A to 3H and 4A to 4H are cross-sectional views taken along lines A-A', B-B' and C-C' of FIGS. 1A to 1H, respectively.

As shown in FIGS. 1A, 2A, 3A and 4A, an underlying structure 21 is formed. The underlying structure 21 may include either a plurality of patterns made of single-crystalline silicon, polysilicon, a field oxide layer, a field nitride layer, a landing plug, etc., or an insulating layer. For example, the underlying structure 21 may include a semiconductor substrate having an active region defined by a device isolation layer. Also, a landing plug may be formed on the active region. The landing plug may be insulated by an interlayer insulating layer.

An etch stop layer 22 is formed on the underlying structure. The etch stop layer 22 may include oxide, nitride, etc.

A plurality of first sacrificial layer patterns 23 are formed on the etch stop layer 22. The first sacrificial layer patterns 23 may include oxide or silicon oxide. The thickness of the first sacrificial layer patterns 23 is controlled in consideration of a height of patterns that are subsequently formed. Here, the patterns that are subsequently formed may include bit lines, storage node contact plugs, or the like.

The first sacrificial layer patterns 23 may be etched using first mask patterns 24. The first mask patterns 24 are line/space (L/S) patterns. More specifically, the first mask patterns 24 are in the form of lines and have a space between lines. The first mask patterns 24 may include a photoresist pattern and a hard mask. In addition, the first mask patterns 24 may be patterned using the photoresist pattern. If a hard mask is used, the hard mask may have a multi-layer structure. The multi-layer hard mask may be made of polysilicon, SiON, an oxide, a carbon compound, or a combination thereof. The first mask patterns 24 may be mask patterns for storage node contacts. For example, the first mask patterns 24 may include a portion where a storage node contact is to be formed, and an insulating portion may be formed between the storage node contact plugs by an opened trench. To form the first sacrificial layer patterns 23, an SPT (spacer patterning technology) process may be used. The SPT process enables the number of lines and spaces to be doubled.

The form of the first mask patterns 24 may be transferred to the first sacrificial layer patterns 23. Thus, the first sacrificial layer patterns 23 may be line/space patterns.

The first sacrificial layer patterns 23 are formed by first forming the first sacrificial layer on the etch stop layer and subsequently etching the first sacrificial layer using the first mask patterns 24 as etch masks. In the etching process, the first sacrificial layer has a high etch selectivity with respect to the etch stop layer 22 such that the etching stops at the etch stop layer 22, and the first sacrificial layer patterns 23 have a vertical etched shape. For example, when the first sacrificial layer patterns 23 are made of oxide and the etch stop layer 22 is made of nitride, a gas based on $C_xF_y$ (x=3~5, and y=5~8) such as $C_4F_6$, $C_4F$, or $C_5F_8$ is used as an etch gas. In addition, a gas based on $CH_xF_y$ (x=1~5, and y=0~8) such as $CH_2F_2$ or $CH_3F$, or a gas such as COS, $O_2$, or $SiCl_4$ may be added as an auxiliary gas, or Ar or Xe gas may be added to stabilize plasma and increase etch selectivity. Also, the etching process may be performed using an ICP (inductively coupled plasma) or an ECR (electron cyclotron resonance) system to prevent striations. Furthermore, a bias power of 50-500 W may be used in the etching process to form striations and achieve a vertical etched shape.

As shown in FIGS. 1B, 2B, 3B and 4B, the first mask patterns 24 are removed.

An isolation layer 25 is formed over the first sacrificial layer patterns 23 and the etch stop layer 22 to fill trenches between the first sacrificial layer patterns 23. The isolation layer may include a material having an etch selectivity with respect to the first sacrificial layer patterns 23. For example, if the first sacrificial layer patterns 23 include oxide, the isolation layer 25 may include nitride. The isolation layer 25 may be used for insulation between bit lines. Also, the isolation layer 25 may insulate between storage node contact plugs.

As shown in FIGS. 1C, 2C, 3C and 4C, second mask patterns 26 are formed on the isolation layer 25. The second mask patterns 26 are line/space (L/S) patterns. The second mask patterns 26 may include a photoresist pattern and a hard mask pattern. If the second mask patterns 26 include a hard mask, the hard mask may be patterned using the photoresist pattern. The hard mask may have a multi-layer structure. The multi-layer hard mask may be made of polysilicon, SiON, oxide, a carbon compound, or a combination thereof. The second mask patterns 26 may be mask patterns for bit lines. For example, the second mask patterns 26 may include a portion where a bit line is to be formed, and an insulating portion between bit lines is covered by a line. The second mask patterns 26 may be orthogonal to the first mask patterns 24 shown in FIG. 1A.

The isolation layer 25 is etched using the second mask patterns 26 as etch masks. Subsequently, the first sacrificial layer patterns 23 beneath the isolation layer 25 are etched. Thus, preliminary isolation patterns 25A and sacrificial patterns 23A are formed. The form of the second mask patterns 26 may be transferred to the preliminary isolation patterns 25A. Thus, the preliminary isolation patterns 25A may be line/space patterns. Because the second mask patterns 26 cross the first sacrificial layer patterns 23, the sacrificial patterns 23A have a square shape when seen from the top. Thus, the preliminary isolation patterns 25A overlap with the underlying sacrificial patterns 23A.

To form the preliminary isolation patterns 25A, an SPT (spacer patterning technology) process may be used. The SPT process enables the number of lines and spaces to be doubled. Also, the etching process may be performed using an ICP (inductively coupled plasma) or an ECR (electron cyclotron resonance) system to prevent striations. In addition, a bias power of 50~500 W may be used in the etching process to form striations and achieve a vertical etched shape.

Trenches 100 are formed after the etching process. The trenches 100 are also called "damascene patterns".

As shown in FIGS. 1D, 2D, 3D and 4D, the second mask patterns 26 are removed. First, a spacer layer 27 may be formed in the trenches 100 and on the preliminary isolation patterns 25A. Subsequently, second sacrificial layer patterns 28 that fill the trenches 100 and are formed on and in between the spacer layer 27. The second sacrificial layer patterns 28 may include spin-on-carbon (SOC). The second sacrificial layer patterns 28 may be formed by applying spin-on-carbon, followed by planarization.

As shown in FIGS. 1E, 2E, 3E and 4E, third mask patterns 29 are formed over the resulting structure including the second sacrificial layer patterns 28. The third mask patterns 29 may include a photoresist pattern. The third mask patterns 29 may be a line/space patterns. For example, the third mask patterns 29 may be orthogonal to the preliminary isolation patterns 25A. The third mask patterns 29 are mask patterns for opening a bit line contact region. Thus, the third mask patterns 29 may be referred to as "bit line contact mask patterns" and may be BLC line mask patterns. The third mask patterns 29 may be formed to open the bit line contact region and cover a storage node contact plug region.

Using the third mask patterns 29 as etch masks, the second sacrificial layer patterns 28 and the spacer layer 27 are etched. Thus, the second sacrificial layer patterns 28 and the spacer layer 27 of the bit line contact region are etched to expose the surface 30 of the underlying structure 21. Although a portion of the preliminary isolation patterns 25A may be exposed by the third mask patterns 29, the preliminary isolation patterns 25A are not etched. More specifically, the preliminary isolation patterns 25A have an etch selectivity with respect to the second sacrificial layer patterns 28. The spacer layer 27 remains in a region in which a storage node contact plug is to be formed. The remaining spacer layer 27A provides insulation between a bit line and a storage node contact plug. The remaining spacer layer 27A becomes a "bit line spacer" 27A. The surface 30 of the underlying structure serves as a "bit line contact region" 30.

As shown in FIGS. 1F, 2F, 3F and 4F, the third mask patterns 29 are removed. Next, the remaining second sacrificial layer patterns 28 are removed. Thus, the trenches (100 in FIG. 2C) are exposed again, and the bit line contact region 30 at the bottom of each of the trenches is exposed.

Each of the trenches 100 is partially filled to form a bit line 31 coming into contact with the bit line contact region 30. After forming the bit line 31, bit line hard masks 32 that fill the trenches 100 above the bit lines 31 are formed. The above-mentioned process of forming the trenches 100 and subsequently filling the bit lines 31 in the trenches 100 is referred to as a damascene process.

The bit lines 31 and the bit line hard masks 32 are formed in the following manner.

First, a conductive layer is formed over the resulting structure including the bit line spacer 27A to fill the trenches 100. Subsequently, CMP and etch-back processes are sequentially performed. The bit lines 31 may include a material containing metal. The bit lines 31 may be made of polysilicon, CVD Ti N, PVD TIN, PVD Co, CVD W, PVD W, or a combination thereof.

Subsequently, the bit line hard masks 32 are formed. The bit line hard masks 32 fill the trenches 100 above the bit lines 31. To form the bit line hard masks 32, a CMP or etch-back process may be performed. The CMP process is performed until the sacrificial patterns 23A are exposed in the A-A' direction and the B-B' direction. As a result, the top of the preliminary isolation patterns 25A is planarized, and the isolation patterns 25B remain between the sacrificial patterns 23A. The bit line hard masks 32 may include nitride.

When the bit lines 31 and the bit line hard masks 32 are formed as described above, the bit lines 31 are surrounded by the bit line hard masks 32 and the bit line spacer 27A. Thus, the bit line 31 is insulated from a storage node contact plug and a capacitor to be formed above the bit line 31. Also, the storage node contact plugs are to be formed in an area defined by the square sacrificial patterns 23A, which are isolated from each other by the isolation pattern 25B and the bit line spacer 27A.

As shown in FIGS. 1G, 2G, 3G and 4G, the sacrificial patterns 23A are selectively removed. The sacrificial patterns 23A may be removed by wet etching. The isolation patterns 25B are not removed because the isolation patterns 256 have an etch selectivity with respect to the sacrificial patterns 23A. When the sacrificial patterns 23A are removed, the etch stop layer 22 is exposed. If the sacrificial patterns 23A include oxide and the isolation patterns 25B include nitride, the etching process is carried out using an etching solution that has a high etch ratio with respect to a nitride layer when an oxide layer is wet-etched. For example, BOE (buffered oxide etcher), hydrofluoric acid (HF), or diluted HF may be used.

To remove the sacrificial patterns 23A, dry etching may be used in addition to wet etching. For example, a gas based on $C_xF_y$ (x=3~5, and y=5~8) such as $C_4F_6$, $C_4F$ or $C_5F_8$ is used as an etch gas. In addition, a gas based on $CH_xF_y$ (x=1~5, and y=0~8) such as $CH_2F_2$ or $CH_3F$, or a gas such as COS, $O_2$, or $SiCl_4$ gas may be added, or Ar or Xe gas may be added to stabilize plasma and increase etch selectivity.

When the sacrificial patterns 23A are removed as described above, spaces for storage node contact plugs are formed. These spaces are referred to as storage node contact holes 101.

Subsequently, the etch stop layer 22 at the bottom of the storage node contact holes 101 is etched to expose the surface of the underlying structure 21.

As shown in FIGS. 1H, 2H, 3H and 4H, storage node contact plugs 33 are formed in the storage node contact holes. The storage node contact plugs 33 are formed through a series of processes, including formation of the sacrificial patterns, formation of the isolation patterns, removal of the sacrificial patterns, and filling of the storage node contact holes 101. This series of processes is referred to as a damascene process. More specifically, the storage node contact plugs 33 may be formed without having to use a hole-type contact mask.

To form the storage node contact plugs 33, a conductive layer is deposited to fill the storage node contact holes 101. After depositing the conductive layer in the storage node contact holes 101, an isolation process may be performed using a CMP or etch-back process. By performing the isolation process, the storage node contact plugs 33 are formed. The storage node contact plugs 33 have a square contact shape insulated by the bit line spacer 27A and the isolation pattern 25B.

The storage node contact plugs 33 may be made of polysilicon, CVD TiN, PVD TiN, PVD Co, CVD W, PVD W, or a combination thereof.

According to the first embodiment as described above, the bit lines 31 and the storage node contact plugs 33 are formed using the damascene process.

Figure 5A:
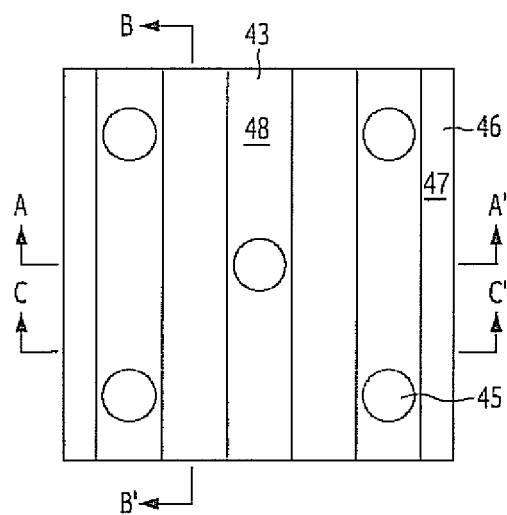
FIGS. 5A to 5F are top views illustrating a method of fabricating a semiconductor device according to a second embodiment of the present invention.
Figure 5B:
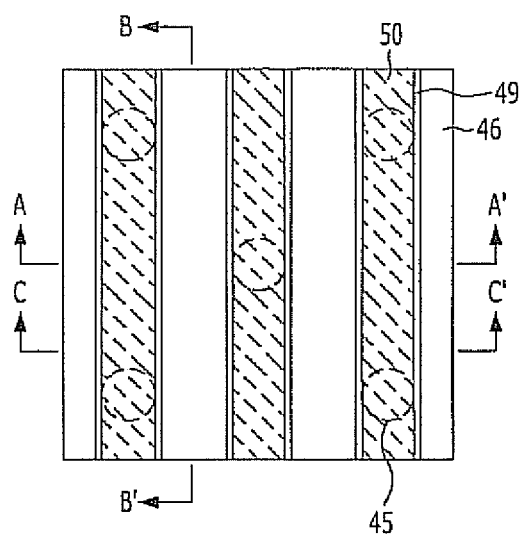
Figure 5C:
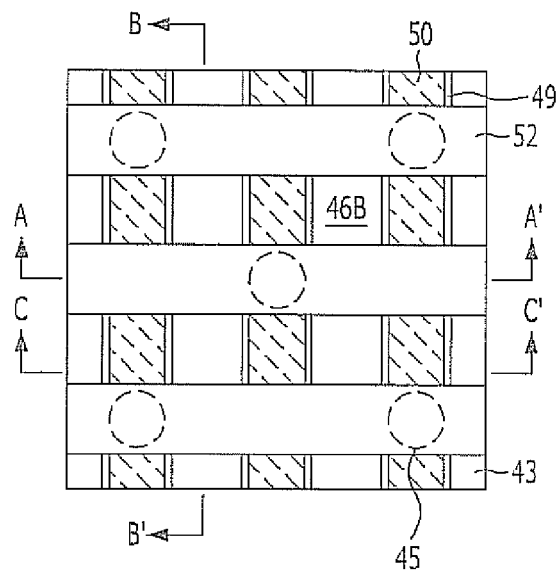
Figure 5D:
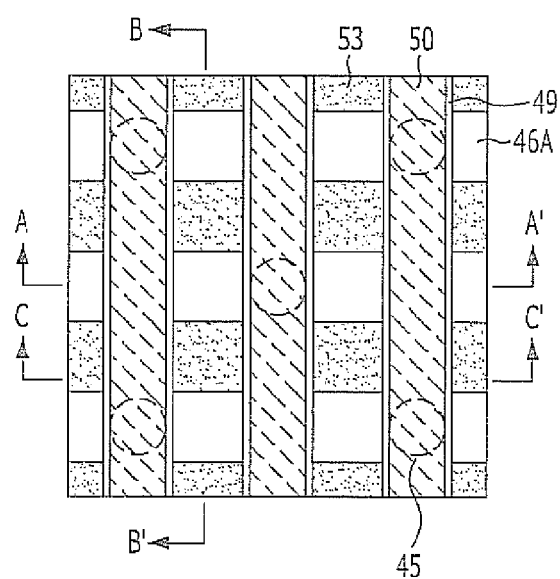
Figure 5E:
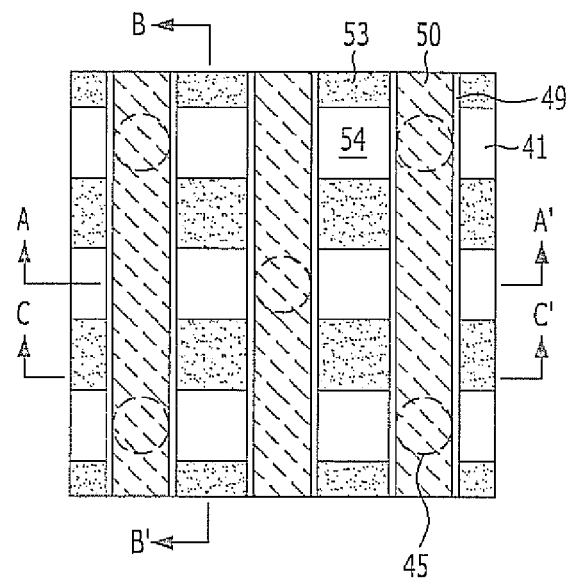
Figure 5F:
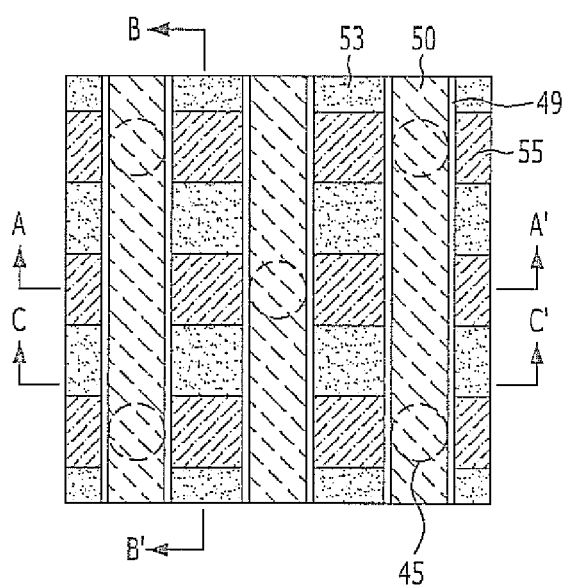
Figure 6A:
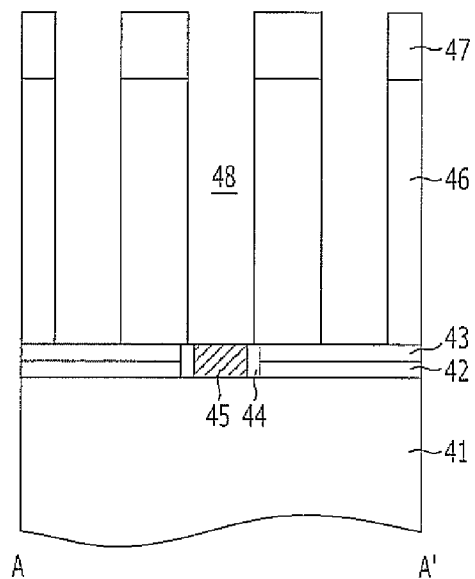
FIGS. 6A to 6F, 7A to 7F, and 8A to 8F are cross-sectional views taken along lines A-A', B-B' and C-C' of FIGS. 5A to 5F, respectively.
Figure 6B:
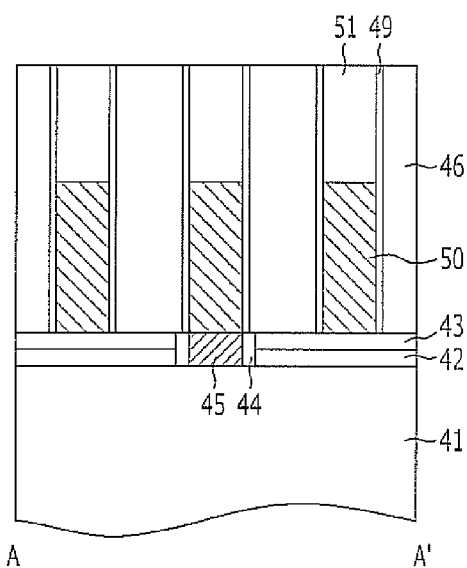
Figure 6C:
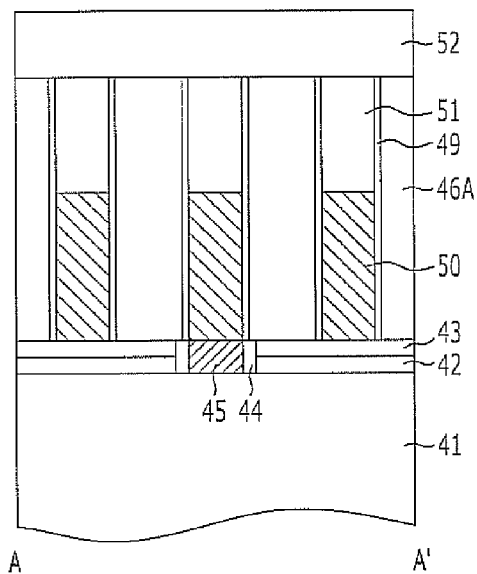
Figure 6D:
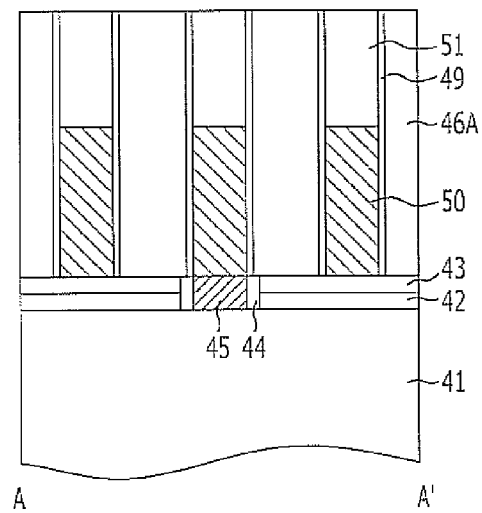
Figure 6E:
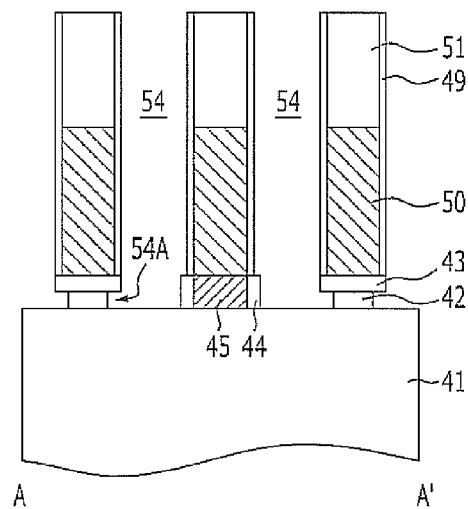
Figure 6F:
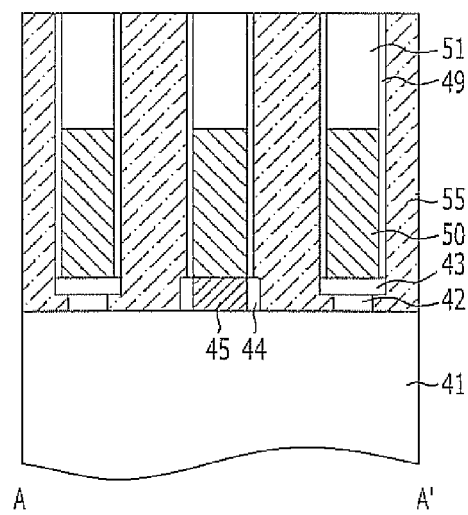
Figure 7A:
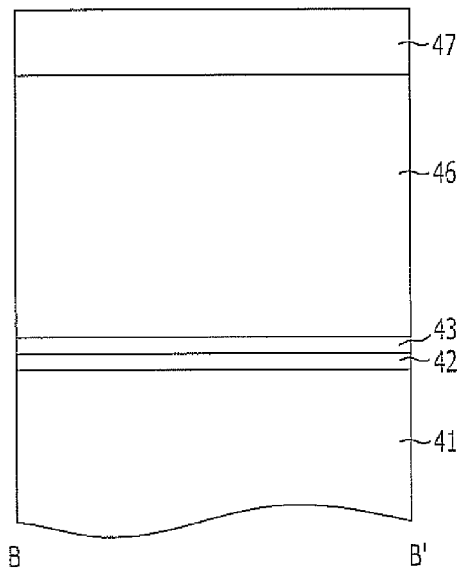
Figure 7B:
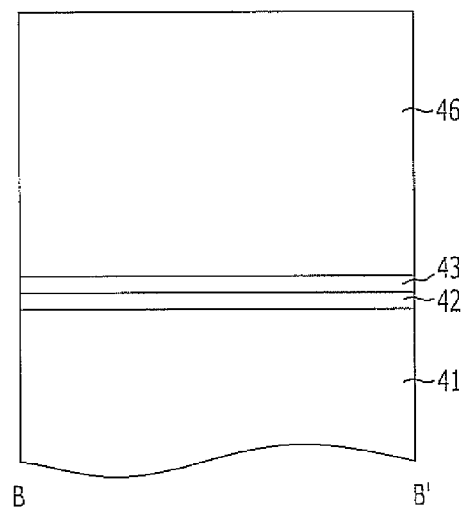
Figure 7C:
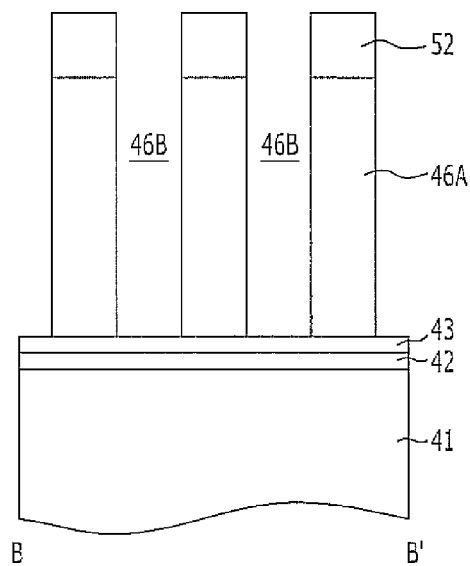
Figure 7D:
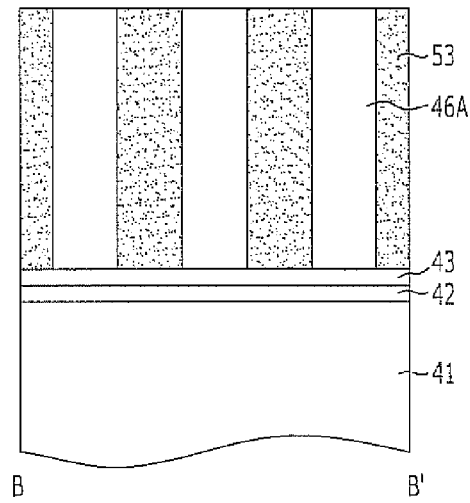
Figure 7E:
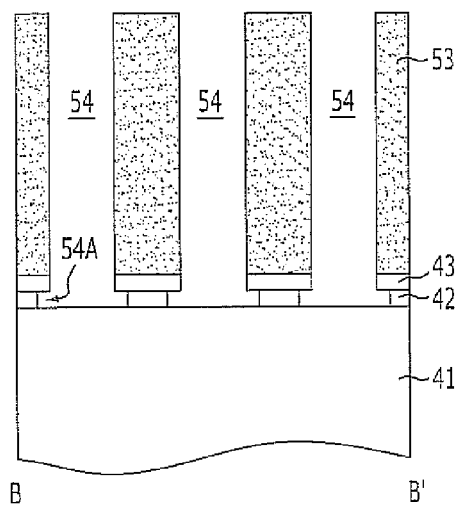
Figure 7F:
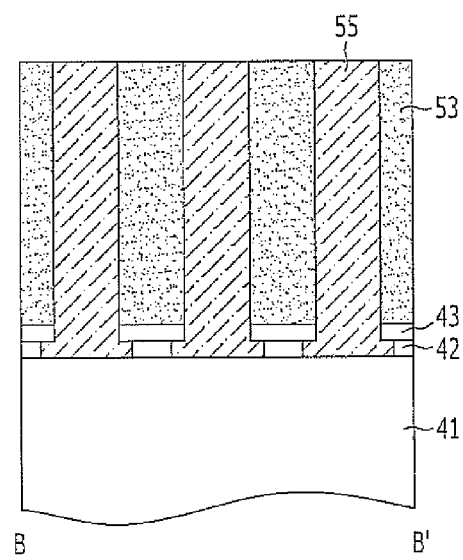
Figure 8A:
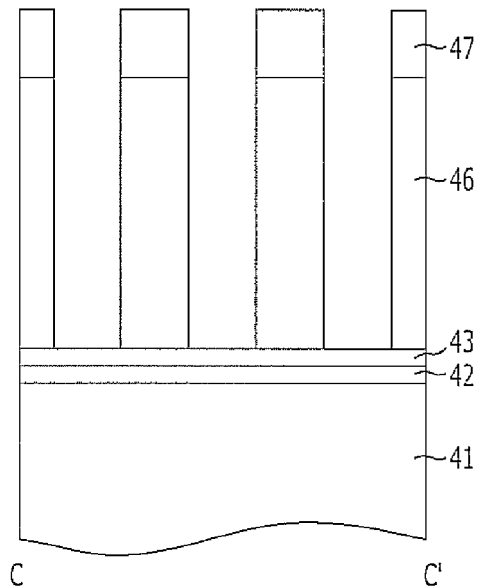
Figure 8B:
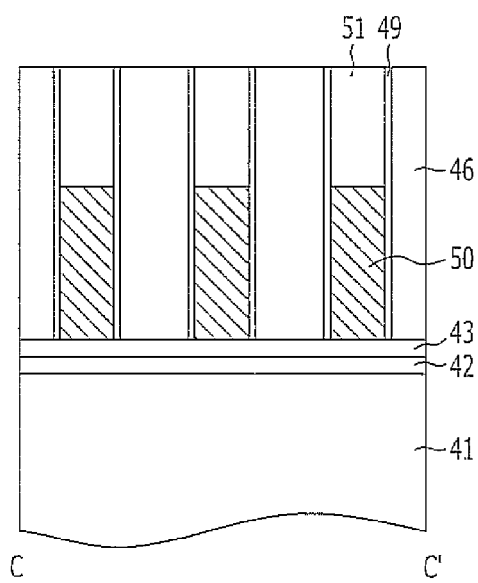
Figure 8C:
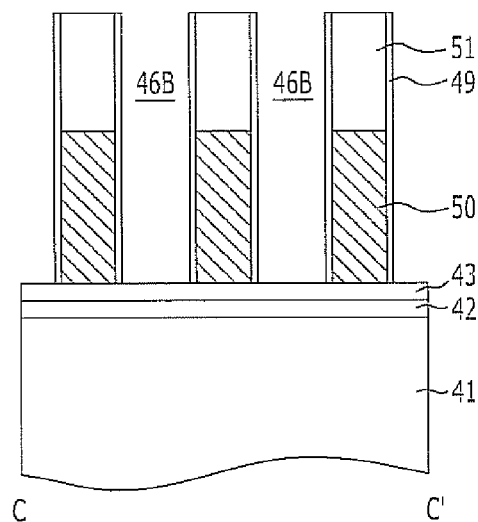
Figure 8D:
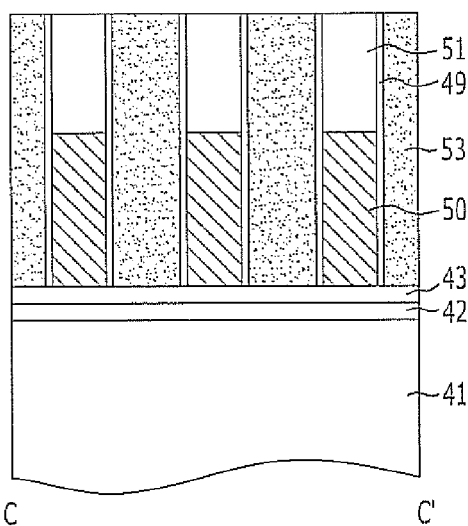
Figure 8E:
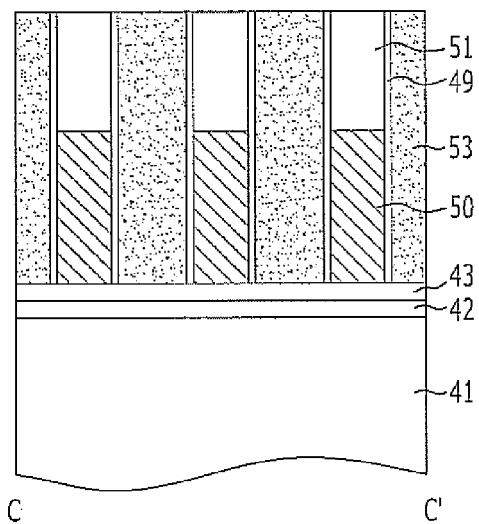
Figure 8F:
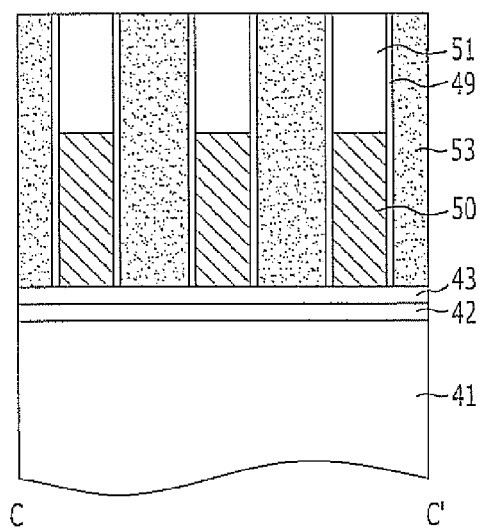

FIGS. 5A to 5F are top views illustrating a method of fabricating a semiconductor device according to a second embodiment of the present invention. FIGS. 6A to 6F, 7A to 7F, and 8A to 8F are cross-sectional views taken along lines A-A', B-B' and C-C' of FIGS. 5A to 5F, respectively As shown in FIGS. 5A, 6A, 7A and 8A, an underlying structure 41 is formed. The underlying structure may include either a plurality of patterns made of single-crystalline silicon, polysilicon, a field oxide layer, a field oxide layer, a field nitride layer, a landing plug, etc., or an insulating layer. For example, the underlying structure 41 may include a semiconductor substrate having an active region defined by a device isolation layer. Also, a landing plug may be formed on the active region. The landing plug may be insulated by an inter-layer insulating layer.

A first insulating layer 42 and a second insulating layer 43 are formed on the underlying structure 41. The first insulating layer 42 may include an oxide layer, and the second insulating layer 43 may include a nitride layer. The first insulating layer 42 is etched by wet etching, whereby the etched first insulating layer 42 increases the area of contact between a storage node contact plug and the active region. The second insulating layer 43 serves as an etch stop layer.

The second insulating layer 43 and the first insulating layer 42 are etched to form bit line contact holes. A bit line contact spacer 44 is formed on the sidewall of the bit line contact holes, and bit line contact plugs 45 are formed in the bit line contact holes after forming the bit line contact spacer 44. A hard mask layer may be used to form the bit line contact holes and may be patterned by a bit line contact mask. The bit line contact mask may be made of a photoresist layer. The hard mask layer may include an amorphous carbon layer and silicon oxynitride. The bit line contact spacer 44 may include a nitride layer. The bit line contact plugs 45 may include Ti, TiN, WN, WSix, W, etc. In order to form the bit line contact plugs 45, a conductive layer for bit line contact plugs is deposited, and an etch-back or CMP process may be subsequently carried out. The bit line contact spacer 44 may be omitted.

On the second insulating layer 43 in which the bit line contact plugs 45 were formed, sacrificial layer patterns 46 are formed. The sacrificial layer patterns 46 are isolated from each other by trenches 48. The sacrificial layer patterns 46 may include oxide or silicon oxide. The thickness of the sacrificial layer patterns 46 is controlled in consideration a height of patterns that are subsequently formed. Here, the patterns that are subsequently formed may include bit lines or storage node contact plugs.

The sacrificial layer patterns 46 may be formed using first mask patterns 47, which have a line/space (L/S) pattern shape, as etch masks. The form of the first mask patterns 47 may be transferred to the sacrificial layer patterns 46. Thus, the sacrificial layer patterns 46 may be line/space patterns. The first mask patterns 47 are in the form of lines and have a space between lines. The first mask patterns 47 may include a photoresist pattern and a hard mask pattern. The hard mask may be patterned using the photoresist pattern. The hard mask may have a multi-layer structure. The multi-layer hard mask may be made of polysilicon, SiON, oxide, a carbon compound, or a combination thereof. The first mask patterns 47 may be referred to as a bit line mask. For example, the first mask patterns 47 may be formed such that an insulating portion between bit lines is covered by a line, and a portion may be formed by opening a space where a bit line is to be formed. To form the sacrificial layer patterns 46, an SPT (spacer patterning technology) process may be used. The SPT process enables the number of lines and spacers to be doubled.

In an etching process for forming the sacrificial layer patterns 46, the sacrificial layer patterns 46 have a high etch selectivity with respect to a nitride layer such that the etching stops at the second insulating layer 43, and the resulting sacrificial layer patterns have a vertical etched shape. A CCP (capacitively coupled plasma) system may be used to form a vertical etched shape. If the sacrificial layer patterns 46 are made of oxide and the second insulating layer 43 is made of nitride, a gas based on $C_xF_y$ (x=3~5, and y=5~8) such as $C_4F_6$, $C_4F$ or $C_5F_8$ is used as an etch gas. In addition, a gas based on $CH_xF_y$ (x=1~5, and y=0~8) such as $CH_2F_2$ or $CH_3F$, or a gas such as COS, $O_2$ or $SiCl_4$ gas may be added as an auxiliary gas, or Ar or Xe gas may be added in order to stabilize plasma and increase etch selectivity. Also, the etching may be performed using an ICP (inductively coupled plasma) or an ECR (electron cyclotron resonance) system to prevent striations. In addition, a bias power of 50~500 W may be used to form striations and achieve a vertical etched shape.

As shown in FIGS. 5B, 6B, 7B and 8B, the first mask patterns 47 are removed. A bit line spacer 49 is formed on the sidewall of the sacrificial layer patterns 46. The bit line spacer 49 may include a nitride layer. To form the bit line spacer 49, a nitride layer may be deposited, and an etch-back process may be subsequently carried out. In addition to the nitride layer, a spacer having an oxide layer, a double layer of oxide layer/nitride layer, a triple layer of nitride layer/oxide layer/nitride layer, or a structure of nitride layer/air gap/nitride layer may be formed as the bit line spacer 49 to reduce the bit line parasitic capacitance ($C_b$).

Bit lines 50 that fill a portion of the trenches 48 are formed over the resulting structure including the bit line spacer 49. To form the bit lines 50, a conductive layer is filled, and subsequently CMP and etch-back processes are sequentially carried out. The bit lines 50 may include a material that contains a metal. The bit lines 50 may be made of CVD TiN, PVD TiN, PVD Co, CVD W, PVD W, or a combination thereof. In the etch-back process, dry etching may be performed using $Cl_2$, $NF_3$, $SF_6$, HBr, Ar, $O_2$, or $CF_4$ gas. Alternatively, wet etching may be performed using sulfuric acid or hydrogen peroxide, or a combination of dry etching and wet etching may be performed.

After forming the bit lines 50, bit line hard masks 51 are formed. The bit line hard masks 51 fill the trench 48 above the bit lines 50. To form the bit line hard masks 51, a CMP or etch-back process may be performed.

As described above, the process of forming the sacrificial layer patterns 46 using the first mask patterns 47 and the process of filling the bit lines 50 are referred to as a damascene bit line process.

As shown in FIGS. 5C, 6C, 7C and 8C, second mask patterns 52 are formed. The second mask patterns 52 are line/space (L/S) patterns. The second mask patterns 52 may include a photoresist pattern and a hard mask. If the second mask patterns 52 include a hard mask, the hard mask may be patterned using the photoresist pattern. The hard mask may have a multi-layer structure. The multi-layer hard mask may be made of polysilicon, SiON, oxide, a carbon compound, or a combination thereof. The second mask patterns 52 may be mask patterns for bit lines. For example, the second mask patterns 52 are formed such that a portion in which a storage node contact plug is to be formed is covered by a line, and an insulating portion between storage node contact plugs is opened by a space. The second mask patterns 52 may be orthogonal to the first mask patterns 46 shown in FIGS. 6A, 7A and 8A.

Using the second mask patterns 52 as etch masks, sacrificial layer patterns 46 are formed. As a result, sacrificial layer patterns 46A are formed and isolated from each other by holes 46B. When the sacrificial layer patterns 46 are etched, a gas based on $C_xF_y$ (x=3~5, and y=5~8) such as $C_4F_6$, $C_4F$ or $C_5F_8$ is used as an etch gas. In addition, a gas based on $CH_xF_y$ (x=1~5, and y=0~8) such as $CH_2F_2$ or $CH_3F$, or a gas such as COS, $O_2$ or $SiCl_4$ gas may be added as an auxiliary gas, or Ar or Xe gas may be added to stabilize plasma and increase etch selectivity. Also, the etching process may be performed using an ICP (inductively coupled plasma) or ECR (electron cyclotron resonance) system to prevent striations. In addition, the etching process may be carried out using a bias powder of 50~500 W to form striations and achieve a vertical etched shape. The holes 46B are square holes.

As shown in FIGS. 5D, 6D, 7D and 8D, the second mask patterns 52 are removed.

An isolation layer 53 is formed over the resulting structure including the sacrificial Layer pattern 46A and the holes 46B, to fill the holes 46B between the sacrificial layer patterns 46A, and a planarization process is performed after forming the isolation layer 53. The isolation layer 53 may include a material having an etch selectivity with respect to the sacrificial layer patterns 46A. If the sacrificial layer patterns 46A include oxide, the isolation layer 53 may include nitride. The isolation layer 53 may insulate between bit lines. In addition, the isolation layer 53 may insulate between storage node contact plugs.

As shown in FIGS. 5E, 6E, 7E and 8E, the sacrificial layer patterns 46A are selectively removed. The sacrificial layer patterns may be removed by wet etching. The isolation layer 53 is not etched because it has an etch selectivity with the sacrificial layer patterns 46A. Also, when the sacrificial layer patterns 46A are removed, the second insulating layer 43 is exposed. BOE (buffered oxide etcher), HF, or diluted HF may be used as an etching solution that has a high etch selectivity with respect to a nitride layer when an oxide is wet etched. The sacrificial layer patterns 46A may also be removed by dry etching.

When the sacrificial layer patterns 46A are removed as described above, spaces for storage node contact plugs are formed. These spaces are referred to as storage node contact holes 54.

After removal of the sacrificial layer patterns 46A, a nitride layer may be deposited to a thickness of 10-150 Å to form a nitride layer spacer to prevent short circuits between a storage node contact plug and a bit line.

Subsequently, the second insulating layer 43 and the first insulating layer 42 are etched to expose the surface of the underlying structure 41. Subsequently, exposed sidewalls of the first insulating layer 42 are anisotropically etched. Thus, the bottom 54A of the storage node contact holes 54 may be widened, and an area of contact between the underlying structure 41 and a storage node contact plug may be increased.

As shown in FIGS. 5F, 6F, 7F and 8F, a conductive layer is filled in the storage node contact holes 54, and an isolation process subsequently is carried out. As a result, storage node contact plugs 55 are formed. When the isolation process is carried out as described above, the storage node contact plugs 55 of a square shape insulated by the spacer layer 49 and the isolation layer 53 are formed. The storage node contact plugs 55 may be made of polysilicon, CVD PVD TIN, PVD Co, CVD W, PVD W, or a combination thereof.

As described above, the storage node contact plugs 55 are formed by performing the process of forming the sacrificial layer patterns 46A using the second mask patterns 52, the process of filling the isolation layer 53, the process of forming the storage node contact holes 54, and the process of filling the storage node contact plugs 55.

According to the second embodiment as described above, the bit lines 50 are formed using the damascene process. In addition, the storage node contact plugs 55 are formed using the damascene process. More specifically, the storage node contact plugs 55 are formed using the second mask patterns 52 and the damascene process rather than forming the storage node contact plugs 55 using hole-type contact masks.

The semiconductor device according to the present invention may be included in a memory cell and a memory cell array. The bit line and the word line may store or output data based on a voltage applied by a column decoder and a row decoder, which are connected with the memory cell array.

The memory cell array according to the present invention may be included in a memory device. The memory device may include a memory cell array, a row decoder, a column decoder, and a sense amplifier. The row decoder selects a word line corresponding to a memory cell, which is to perform a read operation or a write operation, from among the word lines of the memory cell array, and the row decoder transfers a word line selection signal to the semiconductor memory cell array. Also, the column decoder selects a bit line corresponding to a memory cell, which performs a read operation or a write operation, from among the bit lines of the memory cell array, and the column decoder transfers a bit line selection signal to the memory cell. In addition, the sense amplifier senses data selected by the row decoder and the column decoder and stored in the memory cell.

The memory device according to the present invention may be applied, but not limited to, DRAM (dynamic random access memory), SRAM (static random access memory), a flash memory, FeRAM (ferroelectric random access memory), MRAM (magnetic random access memory), PRAM (phase change random access memory) and the like.

The above-described memory device may be applied mainly to desktop computers, notebook computers, and computing memories that are used in servers, as well as graphics memories of various specifications, and mobile memories. In addition, the memory device may be applied to not only portable storage media, such as memory sticks, MMCs, SDs, CFs, xD-picture cards, and USB flash devices, but also various digital applications, including MP3P, PMP, digital cameras, camcorders, and mobile phones. Also, the memory device may be applied to semiconductor device products, MCP (multi-chip package), DOC (disk-on-chip), embedded devices and the like. Furthermore, the memory device may also be applied to CIS (CMOS image sensor) for use in various applications, including camera phones, web cameras, and small-sized photography systems for medical use.

The memory device according to the present invention may be used in a memory module. The memory device includes a plurality of memory devices mounted on a module substrate, a command link enabling the memory devices to receive control signals (address signal, command signal, or click signal) from an external controller, and a data link that is connected with the memory devices to transmit data. Here, the command link and the data link may be formed in a manner identical or similar to those used in conventional semiconductor modules. In the memory module, memory devices may be mounted on the front side of the module substrate, and the memory devices may also be mounted on the back side of the module substrate. More specifically, the memory devices may be mounted on one or both sides of the module substrate, and the number of memory devices mounted is not limited. In addition, the material and structure of the module substrate are not specifically limited.

The memory module according to the present invention may be used in a memory system. The memory system includes at least one memory module having a plurality of memory devices mounted thereon, and a controller that provides a bidirectional interface between external systems to control the operation of the memory module.

The memory system according to the present invention may be used in electronic units. The electronic unit includes a memory system and a processor that is electrically connected thereto. Here, the processors include CPU (central processing unit), MPU (micro processor unit), MCU (micro controller unit), GPU (graphics processing unit) and DSP (digital signal processor). Here, CPU or MPU is in the form of a plurality of control units (CU), which read and analyze a command with ALU (arithmetic logic unit) to control each unit. If the processor is a CPU or an MPU, the electronic unit preferably comprises a computer device or a mobile device. Also, GPU is a CPU for graphic processing which is used to calculate numbers having a decimal point and serves to draw graphics on the screen in real time. If the processor is GPU, the electronic unit preferably contains a graphic device. Also, DSP refers to a processor that converts an analog signal (e.g., sound) to a digital signal at high speed and calculates the digital signal or converts the digital signal to an analog signal again. DSP may calculate digital values. If the processor is DSP, the electronic unit preferably comprises sound and image devices. In addition, the processors include APU (accelerate processor unit), which is in the form of a combination of CPU and GPU and performs the role of a graphic card.

According to the present invention, storage node contact plugs and bit lines are formed using the damascene process without using a hole-type contact mask and a bit line etching process, thereby improving the fabricating yield of highly integrated semiconductor devices.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a plurality of sacrificial patterns, isolated from each other by a plurality of trenches, over an underlying structure;
   forming a plurality of conductive lines filled in the trenches;
   forming first holes by removing portions of the sacrificial patterns, wherein remaining portions of the sacrificial patterns as a whole extend in a direction crossing the conductive lines, and the first holes are defined by the plurality of conductive lines and the remaining portions of the sacrificial patterns;
   forming isolation patterns filled in the first holes;
   forming contact holes by removing the remaining portions of the sacrificial patterns, wherein the contact holes are defined by the plurality of conductive lines and the isolation patterns; and
   forming plugs filled in the contact holes.

2. The method of claim 1, further comprises:
   forming a spacer on sidewalls of the trenches before the forming of the plurality of conductive lines.

3. The method of claim 1, wherein the faulting of the first holes comprises:
   forming mask patterns over the conductive lines and the sacrificial patterns orthogonal to the conductive lines; and
   etching the sacrificial patterns using the mask patterns as etch masks.

4. The method of claim 1, wherein the contact holes and the first holes have a square shape.

5. The method of claim 1, wherein the sacrificial patterns include oxide, and the isolation patterns include nitride.

6. The method of claim 1, wherein the conductive lines include bit lines, and the plugs include storage node contact plugs.

7. A method for fabricating a semiconductor device, the method comprising:
   forming a plurality of sacrificial patterns, isolated from each other by a plurality of trenches, over an underlying structure;
   forming a plurality of conductive lines filled in the plurality of trenches;
   forming a plurality of first holes by removing portions of the sacrificial patterns, wherein remaining portions of the sacrificial patterns as a whole extend in a direction crossing the conductive lines, and the first holes are defined by the plurality of conductive lines and the remaining portions of the sacrificial patterns;
   forming isolation patterns filled in the plurality of first holes;
   forming contact holes by removing the remaining portions of the sacrificial patterns, wherein the contact holes are defined by the plurality of conductive lines and the isolation patterns;
   forming a spacer having an air gap on the sidewalls of the contact holes; and
   forming plugs filled in the contact holes.

8. The method of claim 7, wherein the spacer has the air gap between a first nitride layer and a second nitride layer.

9. The method of claim 7, wherein the conductive lines include bit lines, and the plugs include storage node contact plugs.

10. The method of claim 7, wherein the contact holes have a square shape.

11. A method for fabricating a semiconductor device, the method comprising:
   forming an insulating layer and an etch stop layer over an underlying structure;
   forming a plurality of sacrificial patterns, isolated from each other by a plurality of trenches, on the etch stop layer;
   forming a plurality of bit lines filled in the plurality of trenches;
   forming a plurality of first holes by removing portions of the sacrificial patterns, wherein remaining portions of the sacrificial patterns as a whole extend in a direction crossing the conductive lines, and the first holes are defined by the plurality of conductive lines and the remaining portions of the sacrificial patterns;
   forming isolation patterns filled in the plurality of first holes;
   forming contact holes by removing the remaining portions of the sacrificial patterns, wherein the contact holes are defined by the plurality of bit lines and the isolation patterns;
   etching the etch stop layer and the insulating layer at the bottom of the contact holes;
   etching exposed sidewalls of the insulating layer; and
   forming storage node contact plugs filled in the contact holes.

12. The method of claim 11, wherein the contact holes have a square shape.

13. The method of claim 12, wherein the sacrificial patterns and the insulating layer include oxide, and the isolation patterns and the etch stop layer include nitride.

* * * * *